(12) United States Patent
Montijo

(10) Patent No.: US 10,527,650 B2
(45) Date of Patent: Jan. 7, 2020

(54) MEASUREMENT SYSTEM HAVING A DIGITAL EDGE TRIGGER DETECTION CIRCUIT THAT IS CAPABLE OF OPERATING AT THE FULL SIGNAL BANDWIDTH OF THE MEASUREMENT SYSTEM

(71) Applicant: Keysight Technologies, Inc., Santa Rosa, CA (US)

(72) Inventor: Allen Montijo, Colorado Springs, CO (US)

(73) Assignee: Keysight Technologies, Inc., Santa Rosa, CA (US)

(*) Notice: Subject to any disclaimer, the term of this patent is extended or adjusted under 35 U.S.C. 154(b) by 213 days.

(21) Appl. No.: 15/396,666

(22) Filed: Jan. 1, 2017

(65) Prior Publication Data

US 2017/0254835 A1    Sep. 7, 2017

Related U.S. Application Data

(60) Provisional application No. 62/302,127, filed on Mar. 1, 2016, provisional application No. 62/314,332, filed on Mar. 28, 2016.

(51) Int. Cl.
*G06F 11/30* (2006.01)
*G01R 13/02* (2006.01)

(52) U.S. Cl.
CPC ...... *G01R 13/0254* (2013.01); *G01R 13/0272* (2013.01)

(58) Field of Classification Search
CPC .................................................. G01R 13/0254
See application file for complete search history.

(56) References Cited

U.S. PATENT DOCUMENTS

| | | | |
|---|---|---|---|
| 4,888,588 A | 12/1989 | Castagnozzi | |
| 6,753,677 B1 | 6/2004 | Weller et al. | |
| 7,072,804 B2 | 7/2006 | Weller | |
| 7,352,167 B2 | 4/2008 | Sullivan et al. | |
| 8,374,811 B2* | 2/2013 | Sullivan | G01R 13/0254 702/68 |
| 8,866,659 B2* | 10/2014 | Stein | G01R 13/0254 341/155 |
| 9,239,343 B2* | 1/2016 | Martin | G01R 19/2506 |

* cited by examiner

*Primary Examiner* — Phuong Huynh

(57) ABSTRACT

A measurement system is provided that has a digital edge trigger circuit that is capable of operating at the full signal bandwidth of the measurement system. The digital edge trigger circuit comprises a plurality of processors that process time-interleaved digital data samples output from respective time-interleaved ADCs to perform edge trigger detection. The processors share edge detection information with one another to increase the speed at which edge trigger detection is performed to enable the digital edge trigger circuit to operate at the full signal bandwidth of the measurement system.

20 Claims, 8 Drawing Sheets

MEASUREMENT SYSTEM HAVING A DIGITAL EDGE TRIGGER DETECTION CIRCUIT THAT IS CAPABLE OF OPERATING AT THE FULL SIGNAL BANDWIDTH OF THE MEASUREMENT SYSTEM

CROSS-REFERENCE TO RELATED APPLICATIONS

This applications is a nonprovisional application claiming, under 35 U.S.C. § 119(e), the benefit of the filing date of U.S. provisional application No. 62/302,127, filed on Mar. 1, 2016, entitled "A MEASUREMENT SYSTEM HAVING A DIGITAL EDGE TRIGGER DETECTION CIRCUIT THAT IS CAPABLE OF OPERATING AT A FULL SAMPLING BANDWIDTH OF THE MEASUREMENT SYSTEM," and of the filing date of U.S. provisional application No. 62/314,332, filed on Mar. 28, 2016, entitled "A MEASUREMENT SYSTEM HAVING A DIGITAL EDGE TRIGGER DETECTION CIRCUIT THAT IS CAPABLE OF OPERATING AT THE FULL SAMPLING BANDWIDTH OF THE MEASUREMENT SYSTEM," which are incorporated herein by reference in their entireties.

BACKGROUND

In measurement systems such as digital oscilloscopes, consecutively sampled values of an applied waveform are digitized, stored in a memory, and then used to reconstruct the waveform as a displayable image (the "trace") on a display device by reading and processing the stored values. The stored digital values are typically referred to as an acquisition record, the contents of which correspond to a definite time interval in the history of the applied waveform. The length of the time interval is largely determined by the number of addressable memory locations dedicated to signal acquisition and the rate at which the samples are acquired.

Many activities that are performed with an oscilloscope require that the displayed portion of the acquisition record be in some defined relationship to a detected event in the waveform, such as a rising or falling edge of the waveform, for example. The detected event is commonly referred to as a trigger event, or trigger. When the trigger event being detected is a condition of the waveform itself, the event is referred to as an internal trigger event. When the trigger event being detected is a condition outside of the waveform that has some relationship to the waveform being measured, such as another waveform, the event is referred to as an external trigger event. In response to a detected trigger, some subset of the acquisition record is typically displayed to allow panning and zooming of the trace.

FIG. 1 illustrates a time-versus-voltage plot of a portion of a waveform 2 that includes a rising edge 3 and a falling edge 4, which will be used to define what is meant by an edge trigger, as that term is used herein. A trigger threshold voltage level 5 is the voltage level at which the oscilloscope should trigger. For the rising edge 3, the lower threshold voltage level 6 defines the hysteresis band. To cause a trigger on the rising edge 3, the signal must be below the lower threshold voltage level 6 and then cross above the trigger threshold voltage level 5. For the falling edge 4, the upper threshold voltage level 7 defines the hysteresis band. For the falling edge 4 to cause a trigger, the signal must cross from above the upper threshold voltage level 7 to below the trigger threshold voltage level 5. For a standard edge trigger, there is no time limit for how long it takes for the signal to cross between the lower or upper threshold voltage levels 6 and 7, respectively, and the trigger threshold voltage level 5, although special triggering modes can have such time limits.

Until recently, oscilloscope triggering was performed by analog circuitry running at the specified trigger bandwidth. Although a digital trigger circuit has been developed, most oscilloscope trigger circuits are still analog circuits (i.e., continuous time). Rather than operating on the analog signal directly, a digital trigger circuit operates on the data after it has been digitized by an analog-to-digital converter (ADC), and therefore operates in the discrete time domain.

The higher the bandwidth of the oscilloscope, the more difficult it is to develop the analog trigger circuit. The analog trigger circuit includes a comparator, which is essentially a very high gain amplifier. A high bandwidth comparator pushes the Gain-Bandwidth product of available technologies, so trigger circuit bandwidths are usually much lower than the signal bandwidth for the highest-bandwidth oscilloscopes. For example, an oscilloscope with a signal bandwidth that is greater than 60 Gigahertz (GHz) may have a trigger circuit BW of only 20 GHz.

The highest-bandwidth digital oscilloscopes time interleave multiple ADCs to achieve the required sample rates. With existing digital trigger circuits, all of the digital comparison results for the trigger channel from determining whether the signal is above the higher threshold level, below the lower threshold level, or in between the lower and higher threshold levels must be brought together in one place and then processed at the full sample rate of the oscilloscope. With very high sample rates, e.g., sample rates greater than 100 Gigasamples per second (GSa/s), this presents difficulties, particularly in terms of signal routing and power consumption.

A need exists for a high-bandwidth measurement system having a digital edge trigger circuit that is capable of operating at the full signal bandwidth of the measurement system and that avoids the aforementioned difficulties in terms of signal routing and power consumption.

SUMMARY

The present embodiments are directed to a measurement system having a digital edge trigger circuit that is capable of operating at the full signal bandwidth of the measurement system, and edge detection methods. The measurement system comprises N time-interleaved ADCs and N processors. The time-interleaved ADCs receive and sample a time-varying waveform to produce N digital data sets, respectively, where N is a positive integer that is equal to or greater than 2. Each digital data set comprises digital data samples that are time-interleaved with the digital data samples of the other digital data sets. Each processor receives a respective digital data set and performs an edge trigger detection algorithm that processes the respective digital data set to determine whether a respective early sample in time that is below a lower threshold value, $TH_L$, exists, to determine whether a respective late sample in time that is below $TH_L$ or above a higher threshold value, $TH_H$, exists, and to determine whether a respective early sample in time that is above $TH_H$ exists. The processors share information regarding any early samples in time below $TH_L$, any late samples in time below $TH_L$ or above $TH_H$, and any early samples in time above $TH_H$ to determine whether a trigger threshold level crossing has been detected.

In accordance with embodiment, the processors are connected in a daisy chain configuration such that each processor communicates with at least one adjacent processor in the daisy chain configuration. Each processor performs an edge trigger detection algorithm that processes the respective digital data set to determine whether a respective early sample in time that is below a lower threshold value, $TH_L$, exists, to determine whether a respective late sample in time that is below $TH_L$ or above a higher threshold value, $TH_H$, exists, and to determine whether a respective early sample in time that is above $TH_H$ exists. The processors share information, via the daisy chain configuration, regarding any early samples in time below $TH_L$, any late samples in time below $TH_L$ or above $TH_H$, and any early samples in time above $TH_H$ to determine which early sample in time below $TH_L$, if any exists, is the earliest sample in time below $TH_L$, which late sample in time below $TH_L$ or above $TH_H$, if any exists, is the latest sample in time below $TH_L$ or above $TH_H$, and which early sample in time above $TH_H$, if any exists, is the earliest sample in time above $TH_H$ and after the earliest sample in time below $TH_L$. At least one of the processors acts as a master processor that uses the earliest sample in time below $TH_L$, the latest sample in time below $TH_L$ or above $TH_H$, and the earliest sample in time above $TH_H$ and after the earliest sample in time below $TH_L$ to determine whether a trigger threshold level crossing has been detected.

The method, in accordance with an embodiment, comprises:

in a plurality of processors that receive time-interleaved samples output from respective time-interleaved ADCs, cooperating with one another to perform a first-pass process of an edge trigger detection algorithm, wherein the first-pass process comprises:

determining whether an earliest sample in time exists in each of a plurality of time slots that is below a lower threshold level, $TH_L$, and if so, identifying the earliest samples, determining whether a latest sample in time exists in each of the time slots that is below $TH_L$ or above a higher threshold level, $TH_H$, and if so, identifying the latest samples, and generating an indication that indicates whether the latest sample in time is below $TH_L$ or is above $TH_H$;

and in the plurality of processors, cooperating with one another to perform a second-pass process of the edge detection algorithm, wherein the second-pass process comprises:

for each time slot, if said indication indicates that the latest sample in time from the previous time slot is below $TH_L$, detecting a trigger threshold level crossing by determining whether an earliest sample in time exists in the current time slot that is above $TH_H$, and for each time slot, if said indication indicates that the latest sample in time from the previous time slot is above $TH_H$, detecting a trigger threshold level crossing by determining whether an earliest sample in time exists in the current time slot that is above $TH_H$ and is later in time than the earliest sample in time in the current time slot that is below $TH_L$.

These and other features and advantages will become apparent from the following description, claims and drawings.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
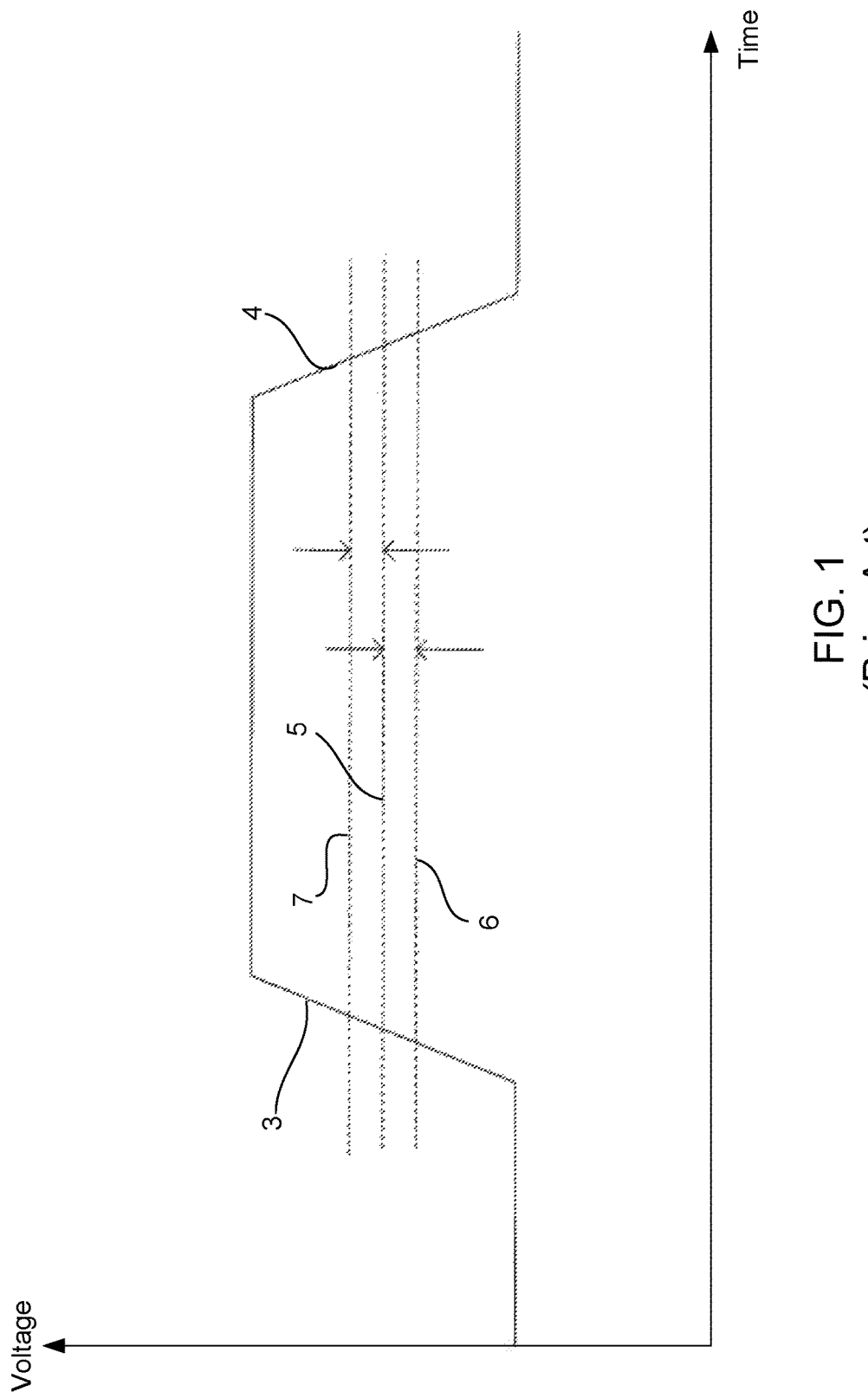
FIG. 1 illustrates a voltage-versus-time trace of a portion of a waveform that includes a rising edge and a falling edge, and which demonstrates an edge trigger.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a," "an," and "the" include both singular and plural referents, unless the context clearly dictates otherwise. Thus, for example, "a device" includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

Figure 2:
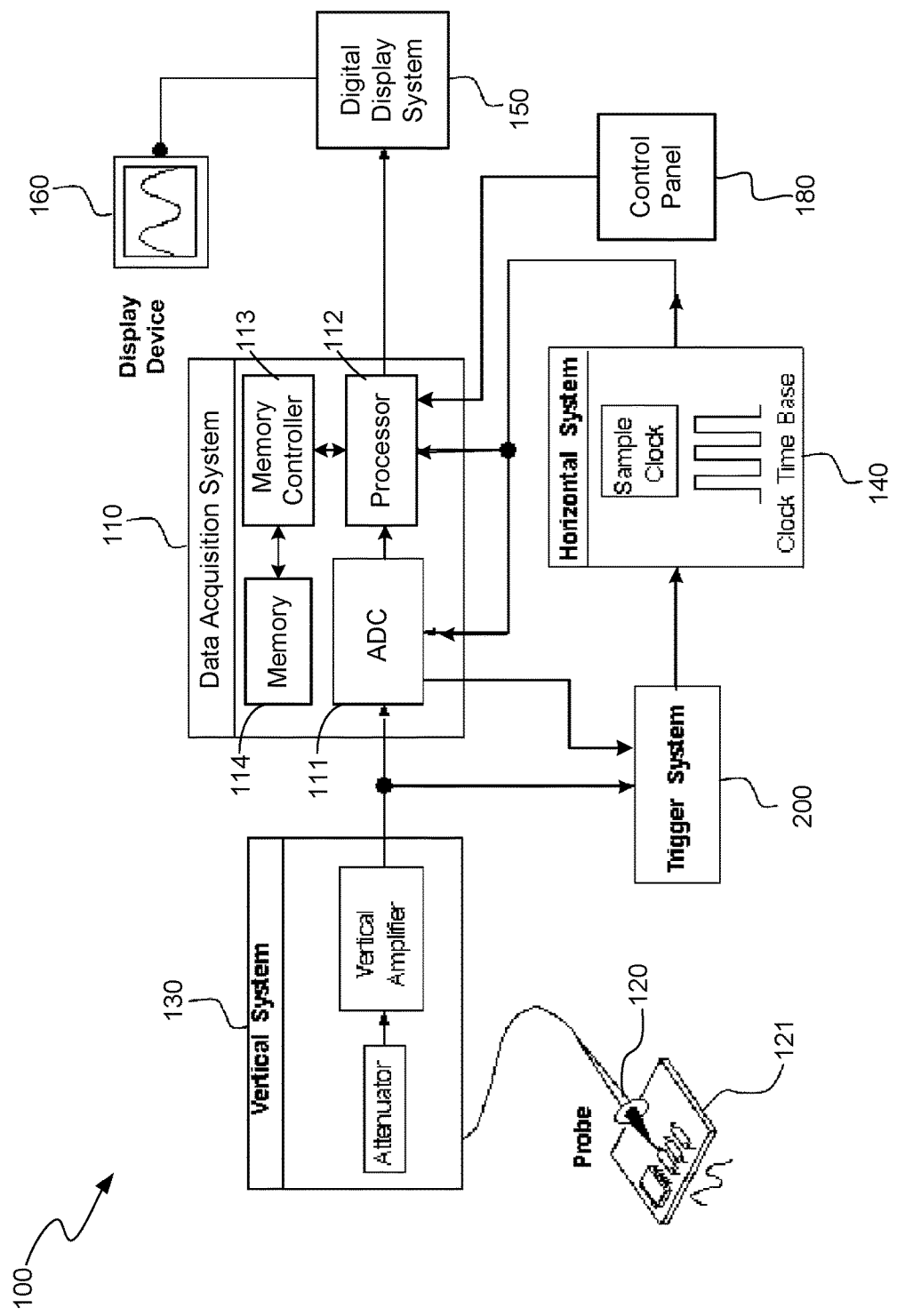
FIG. 2 illustrates a block diagram of the measurement system in accordance with an illustrative embodiment.

FIG. 2 illustrates a block diagram of portions of a measurement system 100 in accordance with an illustrative embodiment having a data acquisition system 110 that includes a digital edge trigger circuit. The measurement system 100 also includes a data acquisition system 110, a probe 120, a vertical system 130, a horizontal system 140, a display system 150, and a display device 160, a control panel 180, and a trigger system 200. The probe 120 is an input device that routes a signal from a device under test (DUT) 121 to the measurement system 100. The vertical system 130 controls the voltage scale on the display device 160. The horizontal system 140 controls the time scale on the display device 160. The display system 150 controls the display of information on the display device 160. The control panel 180 is an input device that allows a user to control the measurement system 100 by making selections that are recognized and acted upon by processor 112 of the data acquisition system 110.

The data acquisition system 110 also includes an ADC 111, a memory controller 113 and a memory device 114. The processor 112 controls the operations of the data acquisition system 110. Digital data samples that are output from the ADC 111 are written to and read from the memory device 114 by the memory controller 113.

In accordance with an illustrative embodiment, the digital trigger circuitry is part of the trigger system 200. The trigger system 200 detects trigger events and informs the data acquisition system 110 when a trigger event is detected. The trigger system 200 also stabilizes and focuses the measurement system 100 so that the waveform being displayed on the display device 160 appears static and unflinching.

Figure 3:
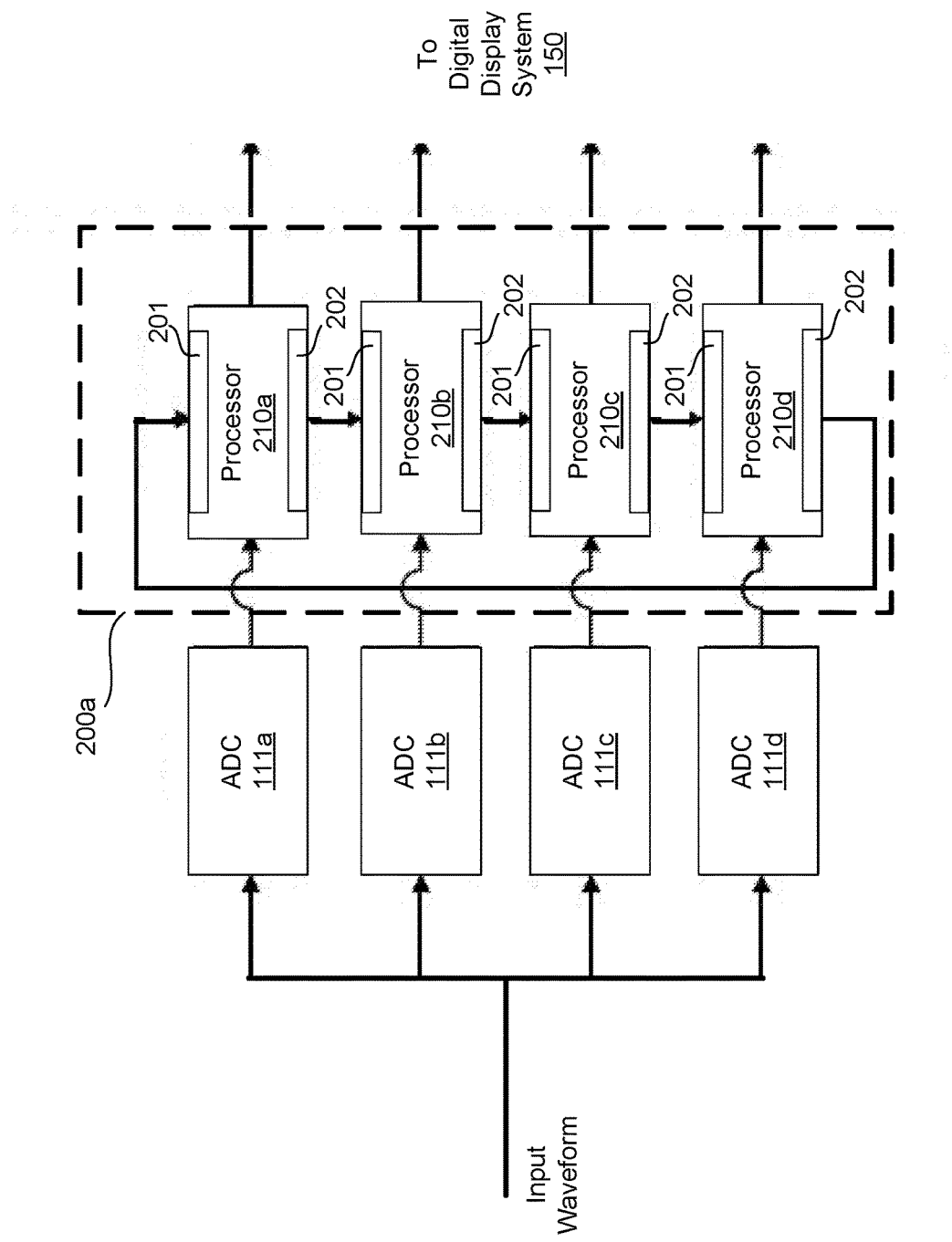
FIG. 3 illustrates a block diagram of a portion 200a of the trigger system 200 shown in FIG. 2 associated with a single channel of the measurement system shown in FIG. 2 in accordance with an illustrative embodiment.

FIG. 3 illustrates a block diagram of a portion 200a of the trigger system 200 shown in FIG. 2, in accordance with an illustrative embodiment. The trigger system 200 typically has one of the portions 200a shown in FIG. 2 per channel of the measurement system 100. In accordance with this embodiment, the trigger system portion 200a includes four processors 210a-210d that receive the outputs of the ADCs 111a-111d. The ADCs 111a-111d are part of the data acquisition system 110, but their outputs are used by the trigger system 200. The measurement system 100 may have any number, N, of ADCs $111_1$-$111_N$ and processors $210_1$-$210_N$, where N is a positive integer that is greater than or equal to 2. The ADCs 111a-111d are time interleaved in that they each sample the input waveform being measured in a window of time that is slightly offset from the windows of time in which the other ADCs 111a-111d sample the waveform. Each ADC 111a-111d produces a respective acquisition record comprising a plurality of digital data samples.

The digital data samples output by the ADCs 111a-111d are received by the respective processors 210a-210d. In accordance with this illustrative embodiment, each processor 210a-210d is a separate ASIC chip configured to perform an edge trigger detection algorithm that processes the digital data samples received from the respective ADC 111a-111d to find an edge trigger. In accordance with an illustrative embodiment, each processor 210a-210d has first and second serializer/deserializer (SERDES) interfaces 201 and 202, respectively, by which the processors 210a-210d are interconnected in a daisy chain configuration. In other words, the first processor 210a is connected to the second processor 210b, the second processor 210b is connected to the third processor 210c, the third processor 210c is connected to the fourth processor 210d, and the fourth processor 210d is connected to the first processor 210a.

Because SERDES technology is well known, a detailed discussion of the SERDES interfaces 201 and 202 will not be provided herein in the interest of brevity. Generally, the SERDES interfaces 201 convert a parallel bit stream into one or more serial bit streams for use by the receiving processor 210a-210d and the SERDES interfaces 202 convert one or more serial bit streams into a parallel bit stream for transmission to an adjacent processor 210a-210d. The SERDES interfaces 201 and 202 allow specific, limited amounts of information to be communicated via the daisy chain configuration at very high speed to enable the processors 210a-210d to cooperate with one another to quickly locate an edge trigger, as will now be described with reference to FIG. 4.

Figure 4:
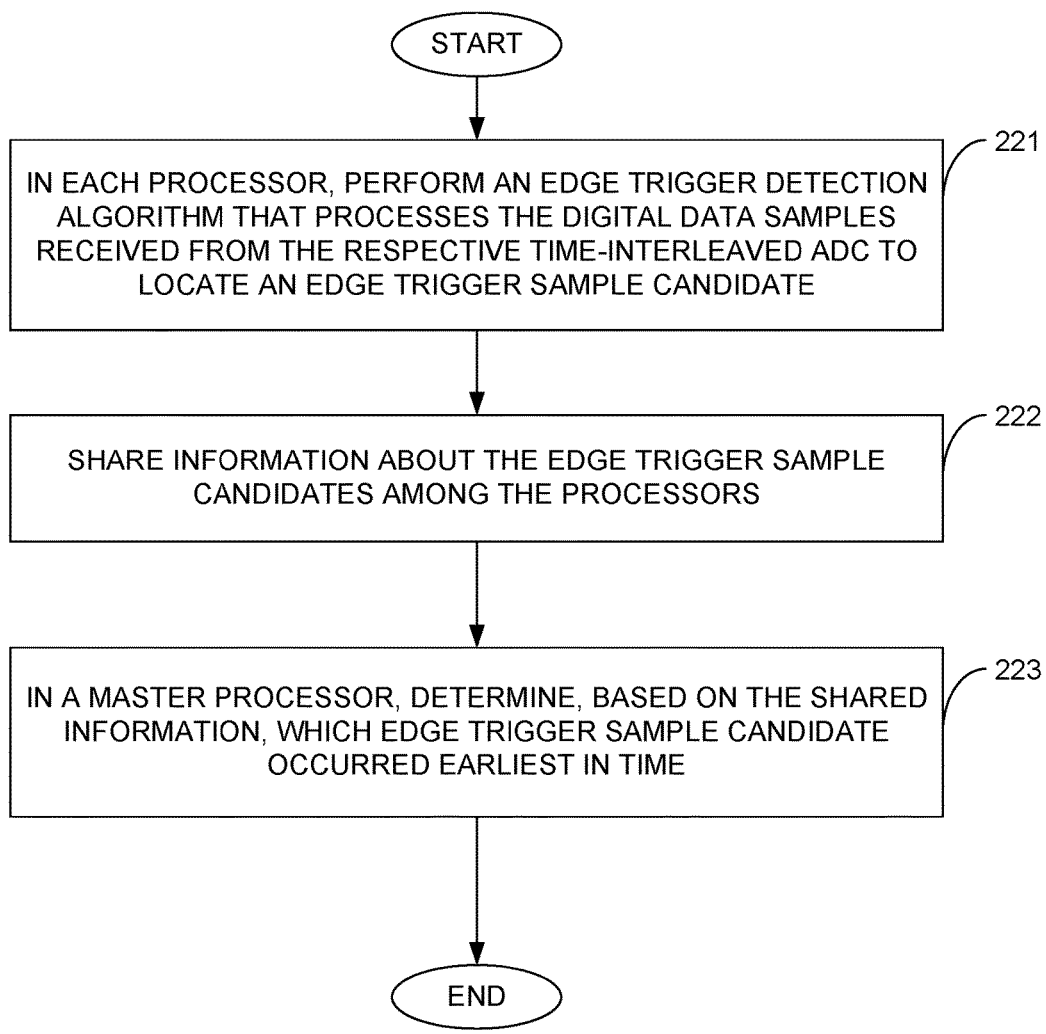
FIG. 4 illustrates a flow diagram that represents the edge detection algorithm performed by the processors shown in FIG. 3 to locate an edge trigger.

FIG. 4 illustrates a flow diagram that represents the edge detection algorithm performed by the processors 210a-210d to locate an edge trigger in a single chunk, or time slot. The processors 210a-210d process the data in time slots, or chunks. The chunks have a size that is determined by the bandwidth of the SERDES interfaces 201 and 202 and the sample rates of the ADCs 111a-111d. Each chunk is made up of samples from all of the ADCs 111a-111d. As indicated above, the ADCs 111a-111d are interleaved in time in that they sample the waveform at slightly different instants in time. In some cases, it is desirable to make the chunks as small as possible to limit latency and to limit the sizes of the buffers (not shown) inside of the processors 210a-210d that temporarily store the data. For this example, it is also assumed that the edge detection algorithm is "armed" at the beginning of the start of the algorithm. As will be described below in more detail, the algorithm becomes armed when it detects a latest sample in time in a previous chunk or an earliest sample in time in the current chunk that is below a lower threshold level, $TH_L$.

Each of the processors 210a-210d processes the digital data samples received from a respective one of the ADCs 111a-111d to locate a sample that may indicate the existence of an edge trigger, as indicated by block 221. This sample will be referred to hereinafter as an "edge trigger sample candidate." The term "edge trigger sample candidate," as that term is used herein, denotes the earliest sample in time after the algorithm has been armed that is above $TH_H$. As indicated above, the algorithm is assumed, for exemplary purposes, to have been armed due to the earlier detection of a sample that is below $TH_L$. It is possible that none of the processors 210a-210d locates a sample that is above $TH_H$ and that occurred after the algorithm became armed, but for this example it will be assumed that at least one of the processors 210a-210d has detected an edge trigger sample candidate. Assuming for exemplary purposes that processor 210a is acting as the master processor, the other processors 210b-210d share information about their edge trigger sample candidates among themselves and with master processor 210a via the daisy chain configuration, as indicated by block 222. The master processor 210a then determines, based on the shared information, which of the edge trigger sample candidates occurred earliest in time, as indicated by block 223. As will be described below in more detail, which of the processors 210a-210d acts as the master processor can change during the performance of the edge trigger detection algorithm.

In accordance with an illustrative embodiment, the edge trigger detection algorithm is a two-pass algorithm in that it performs a first pass to determine when to arm the algorithm and a second pass to determine where the trigger threshold level crossing occurred. Each of the processors 210a-210d knows the relative time offset of the samples it is processing. For example, if the data is being processed in 5 nanosecond (ns) chunks in the four-way interleaved system shown in FIG. 3, then each processor 210a-210d knows if it is the first, second, third, or fourth in sampling time order. It also knows whether it is first, last, or other in processing order. In some embodiments, other information may be known to each of the processors 210a-210d, such as whether it is next to last in the processing order.

The first processor in the processing order starts passing information obtained during the first pass and the other processors wait until they receive the first-pass information from the previous processor in the processing order before passing their first-pass information to the next processor in the processing order. Each processor then either modifies the first-pass information before passing it on to the next processor, or passes it on without modifying it, as will be described below with reference to FIGS. 5A and 5B. The last processor in the processing order completes the first-pass process and therefore has the fully-resolved first-pass information available to it to start the second-pass process. Therefore, the second-pass process can be fully resolved by the second-to-last processor in the processing order.

For ease of illustration, processor 210a is described as the master processor and processor 210b is described as the first processor in the processing order in all of the illustrative embodiments described herein. However, it is more efficient for the master processor to change such that after each pass, the processor that is one position earlier in the processing order becomes the master processor for the next pass, although normally no advantage is obtained by rotating the master processor in between chunks. Also, while the first- and second-pass processes are described herein as though the first-pass process starts on the next chunk as the second-pass process completes on the current chunk, this is typically not the case. For example, the first-pass and second-pass processes may be processed fifty chunks apart such that the first-pass process is performed on chunk #51 at the same time that the second-pass process is performed on chunk #1.

The information shared in the step represented by block 222 is typically a multi-bit index. For example, in accordance with an illustrative embodiment, the index is a ten-bit index. The lower significant bits of the index indicate which of the ADCs 111a-111d the data was output from in time order. The more significant bits of the index indicate which samples per ADC 111a-111d is referred to by the index. For example, if there are 160 samples in a chunk per ADC 111a-111d, and there is four-way time interleaving, then there are 640 samples in a chunk. The more significant bits indicate which of the 160 samples of the 640 samples are referred to by the index.

Figure 5A:
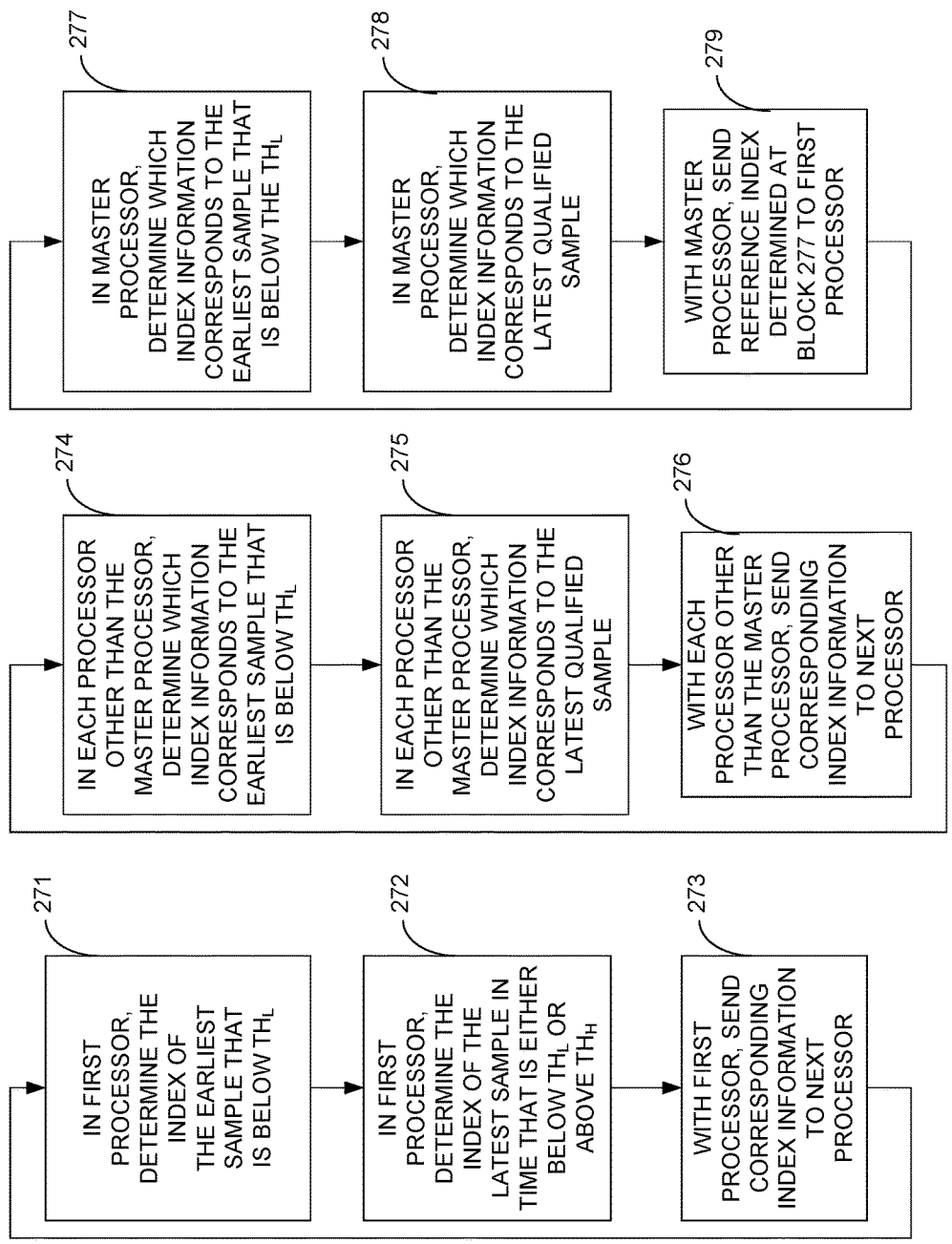
FIG. 5A illustrates a flow diagram of a first pass of a two-pass of the edge detection algorithm in accordance with an illustrative embodiment.
Figure 5B:
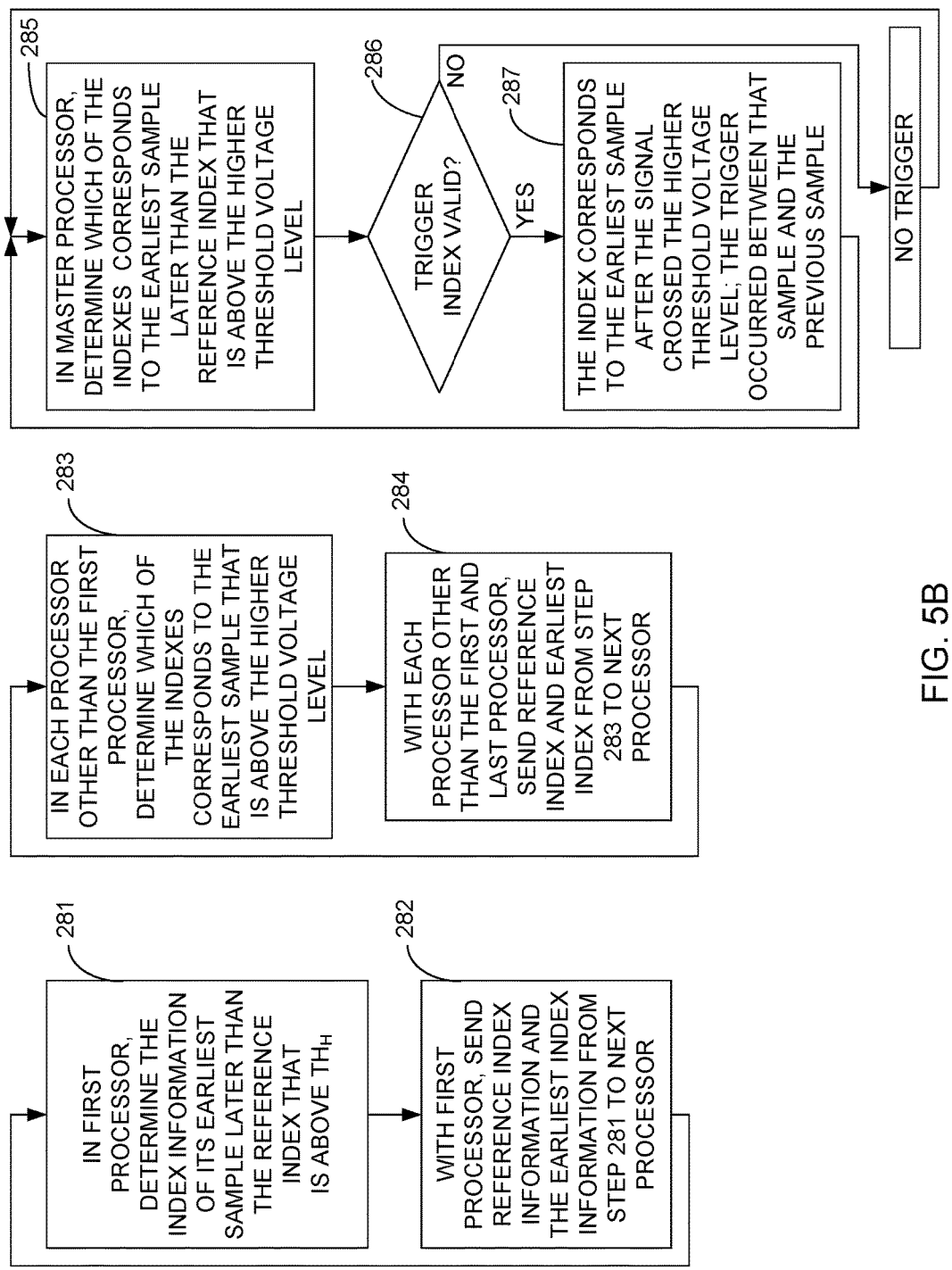
FIG. 5B illustrates a flow diagram of a second pass of the two-pass edge detection algorithm in accordance with an illustrative embodiment.

FIGS. 5A and 5B illustrate flow diagrams of the first- and second-pass processes, respectively, of the edge detection algorithm performed by the trigger system portion 200a shown in FIG. 3. The algorithm uses a lower threshold voltage level, $TH_L$, and a higher threshold voltage level, $TH_H$, for hysteresis. For a rising edge trigger, the trigger threshold level is $TH_H$. On the first pass, the first processor in the processing order determines the index of its earliest sample in time that is below $TH_L$, as indicated by block 271. For exemplary purposes, it will be assumed that the first processor in the processing order is processor 210b and that the last processor in the processing order is processor 210a. It will also be assumed that processor 210a is the master processor. Determining the earliest sample in time that is below $TH_L$ during the first-pass process is part of arming the algorithm as early as possible to prepare it to detect a trigger threshold level crossing in the time slot at a later time during the second-pass process.

The first processor 210b also determines the index of its latest sample in time that is either above $TH_H$ or below $TH_L$, as indicated by block 272. The latest sample in time that is either below $TH_L$ or above $TH_H$ will be referred to hereinafter as the latest qualified sample. Determining the latest qualified sample during the first-pass process is part of determining the starting state that is used to indicate whether or not the algorithm is armed at the time that it begins processing the next chunk. If the latest qualified sample is below $TH_L$, then the algorithm is armed prior to starting processing of the next chunk, and therefore the first-pass process can be skipped when processing the next chunk. If the latest sample in time in the current chunk is above $TH_H$, then the algorithm is not armed at the time that it starts processing of the next chunk, and therefore the first-pass process is performed on the next chunk to determine the earliest sample that is below $TH_L$, which will determine the timing of when the algorithm is armed for that chunk.

The first processor 210b then sends the corresponding indices for the earliest and latest samples to the next processor 210c in the processing order, as indicated by block 273. The first processor 210b also sends an indication (e.g., a bit) that indicates whether the latest qualified sample determined at block 272 is above $TH_H$ or below $TH_L$ and an indication (e.g., a bit) that indicates whether the sample is "valid" or "invalid." In this example, less than all of the available indices are needed, and therefore an otherwise unused index, such as all 1s, can be used to indicate invalid. One of the "invalid" indications indicates that the processor 210b did not find a sample below $TH_L$. One of the invalid indications indicates that the processor 210b did not find a latest qualified sample. The "valid" indications indicate the opposite of the invalid indications. For ease of discussion, it will be assumed that all of these indications and the index itself comprise "index information."

At the step represented by block 274, each of the processors 210c-210d, and 210a analyzes the index information received from the previous processors 210b-210d, respectively, in the daisy chain configuration to determine whether its index information or the received index information corresponds to the earliest sample in time below $TH_L$. As indicated above, each processor 210c-210d, and 210a waits to receive the index information determined by the processor that precedes it 210b-210d, respectively, in the processing order before making its determination. To reduce latency, each processor has already determined its earliest sample in time below $TH_L$ by the time that it receives the index information from the preceding processor in the processing order. The process represented by block 274 is performed in a sequence as follows: processor 210b performs the process and sends the resulting index information to processor 210c; processor 210c performs the process and sends its resulting index information to processor 210d; processor 210d performs the process and sends its index information to processor 210a.

In the step represented by block 275, each of the processors 210c-210d, and 210a analyzes the index information received from the preceding processor 210b-210d, respectively, in the daisy chain to determine whether its index information or the received index information corresponds to the latest sample in time that is either above $TH_H$ or below $TH_L$. As with the process represented by block 274, the process represented by block 275 is performed by the processors 210c-210d, and 210a in a sequence in accordance with the processing order.

In the step represented by block 276, each of the processors 210b-210d sends the index information for the earliest sample and for the latest qualified sample to the processor that follows it in the daisy chain configuration. As indicated above, the index information includes indications (e.g., one or more bits) of whether the earliest sample and the latest qualified sample are valid or invalid and whether the latest sample is below $TH_L$ or above $TH_H$. Because processor 210a is the master processor and the last processor in the processing order in this example, it does not forward index information to processor 210b. The master processor 210a keeps track of the latest qualified sample from the previous chunk so that it knows the starting state to be used for the current chunk in the case where the latest sample is below $TH_L$. For example, assuming the latest qualified sample in chunk N was above $TH_L$ and the signal entered and remained in the hysteresis region between $TH_L$ and $TH_H$ for many subsequent chunks, or time slots, then as the master processor 210a completes the first-pass processing for time slot N+1, it will observe based on the corresponding invalid bit sent with the index information that no latest sample exists that is below $TH_L$ or above $TH_H$ for time slot N+1. The master processor 210a will retain this information as the final state of time slot N+1 and will pass this information forward through as many time slots as is necessary for use in determining the starting state in subsequent processing of subsequent time slots. In that case, the algorithm will not arm until it finds an earliest sample in time that is below $TH_L$.

At the step represented by block 277, the master processor 210a analyzes the index information received from the previous processor in the daisy chain, processor 210d in this example, and determines whether its index information or the received index information corresponds to the earliest sample in time that is below $TH_L$. At the step represented by block 278, the master processor 210a analyzes the index information received from processor 210d and determines whether its index information or the received index information corresponds to the latest qualified sample. Steps 277 and 278 include analyzing the valid and invalid bits and step 278 also includes analyzing the bit that indicates whether the latest qualified sample is below $TH_L$ or above $TH_H$.

The index information corresponding to the earliest sample determined at step 277 becomes the reference index information to be used by the first processor in the processing order, which in this example is processor 210b, to start the second-pass process. This index information corresponds to the point in time at which the algorithm became armed. Therefore, the reference index determined at state 277 is sent to the first processor in the processing order, as indicated by block 279. If the reference index is invalid, it is not necessary to perform the second-pass process, although it may be performed.

With reference to FIG. 5B, during the second pass of the algorithm, the first processor 210b uses the reference index to determine the earliest sample that is later than the reference index and above the $TH_H$, as indicated by block 281. The first processor 210b then sends the corresponding index information and the reference index to the next processor 210c, as indicated by block 282. The processors other than the first processor then sequentially determine which index corresponds to the earliest sample that is later than the reference index and above $TH_H$, as indicated by block 284. The term "sequentially" means that processor 210c determines, between its own early index and the index passed to it by processor 210b, which is the earliest and passes the earliest index information and the reference index along to processor 210d; processor 210d then determines, between its own early index and the index information passed to it, which is the earliest index and passes it and the reference index along to processor 210a.

At block 285, the master processor 210a determines whether the index it received or its own index is the earliest index after the reference index that is above $TH_H$. Assuming one of these indexes is later than the reference index and above $TH_H$, the master processor 210a will determine at block 286 that a valid trigger occurred. This index corresponds to the earliest sample after the signal crossed $TH_H$. Based on this information, the master processor 210a knows that the trigger threshold level crossing occurred between the sample determined at step 285 and the immediately preceding sample.

Figure 6:
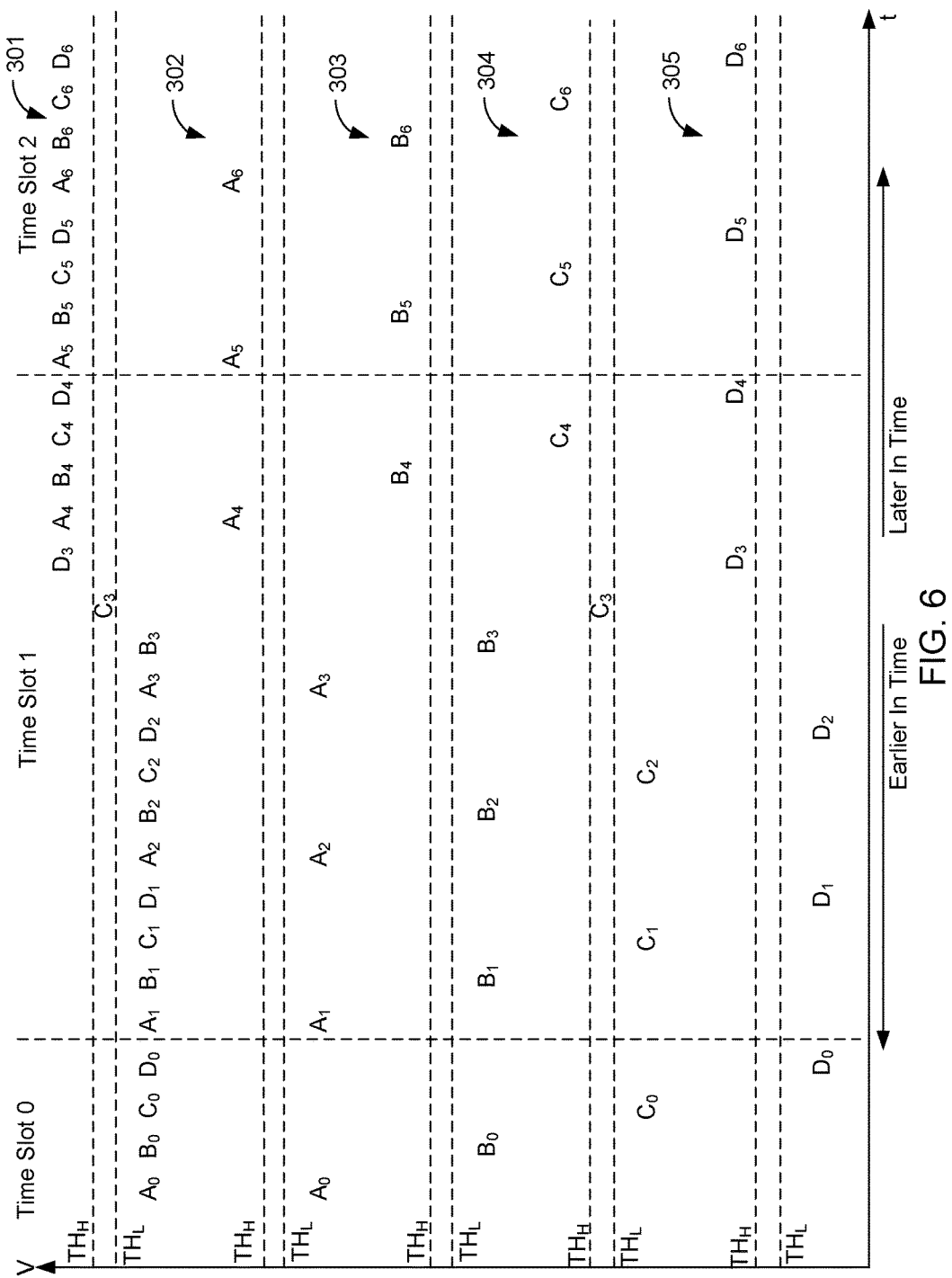
FIG. 6 illustrates plots of digital data samples output from the ADCs shown in FIG. 3 over a time period that will be used to provide an example of the manner in which the processors shown in FIG. 3 process samples output from the respective ADCs and share information to detect a rising edge trigger.

FIG. 6 illustrates a plot of digital data samples output from the ADCs 111a-111d over a time period and will be used to provide an example of the manner in which the processors 210a-210d process samples and share information to detect a rising edge trigger. To achieve the high sample rate, the digital data samples output from the ADCs 111a-111d are time interleaved. For this example, three time slots are used: time slot 0, time slot 1 and time slot 2. Only the last part of time slot 0 and first part of time slot 2 are shown. The vertical dashed lines represent the boundaries between adjacent time slots. The horizontal dashed lines represent $TH_L$ and $TH_H$. Within each time slot, a determination will be made as to whether or not a trigger threshold level crossing occurred. In accordance with this embodiment, the starting state for the next time slot is also determined within each time slot, as described above. For this example, it will be assumed that processor 210a acts as the master processor and that the aforementioned two-pass algorithm is performed.

The plot shows five waveforms made up of a plurality of digital data samples. The top waveform 301 in the plot shows the time-interleaved samples from the time-interleaved ADCs 111a-111d. The top waveform 301 shows the samples combined to clearly depict their relationships to one another in time, although they are not actually combined in any one of the processors 210a-200d. As indicated above, the known digital trigger circuits require that all of the digital comparison results be brought together in one location in order to perform trigger detection, but that is not a requirement of the illustrative embodiments described herein.

The second waveform 302 from the top of the plot, made up of samples $A_0$-$A_6$, corresponds to the output of ADC 111a. The third waveform 303 from the top of the plot, made up of samples $B_0$-$B_6$, corresponds to the output of ADC 111b. The fourth waveform 304 from the top of the plot, made up of samples $C_0$-$C_6$, corresponds to the output of ADC 111c. The fifth waveform 305 from the top of the plot, made up of samples $D_0$-$D_6$, corresponds to the output of ADC 111d. The second waveform 302 is input to processor 210a. The third waveform 303 is input to processor 210b. The fourth waveform 304 is input to processor 210c. The fifth waveform 305 is input to processor 210d.

For this example, only the portion of the first pass of the algorithm that locates the latest qualified sample in time is described for time slot 0. As indicated above, the first pass also determines the earliest sample in time that is below $TH_L$, but that portion of the first pass is not described for time slot 0 for ease of illustration. During the first pass, the processors 210a-210d locate the respective latest qualified samples in time. In time slot 0, all four samples $A_0$, $B_0$, $C_0$ and $D_0$ qualify within their respective processors 210a-210d. Processor 210b sends sample $B_0$ index to processor 210c. The sample index indicates when the sample occurred. Based on this information, processor 210c determines that its latest sample in time, sample $C_0$, is later in time than sample $B_0$, and therefore sends the sample $C_0$ index to processor 210d. Based on this information, processor 210d determines that its latest sample in time, $D_0$, is later in time than sample $C_0$, and therefore sends the sample $D_0$ index to processor 210a. Based on this information, processor 210a, acting as the master processor, determines that sample $D_0$ is later in time than sample $A_0$, and therefore saves information indicating that a latest qualified sample exists in time slot 0 and that the sample is below $TH_L$. The existence of the latest qualified sample and whether it is below $TH_L$ or above $TH_H$ is all that is needed by the processor 210a to determine that a trigger exists in time slot 1 if processor 210a subsequently determines that any sample in time slot 1 is above $TH_H$. Thus, the latest qualified sample found during the first pass for a given time slot is used to determine the starting state for processing the samples in succeeding time slots unless a trigger occurs in one of the succeeding time slots that disarms the algorithm.

Although only a portion of time slot 0 is shown for ease of illustration, the first pass information from time slot 0 indicates that the latest qualified sample in time is sample $D_0$, and that it is below $TH_L$. If, for example, sample $A_1$ were above $TH_H$, then a trigger would exist somewhere in between sample $D_0$ and sample $A_1$. The first pass for time slot 1 is performed as follows. Within processors 210a-210d, the processors 210a-210d determine that samples $A_1$, $B_1$, $C_1$ and $D_1$, respectively, are the earliest samples in time that are below $TH_L$. Processor 210b sends sample $B_1$ index information to processor 210c. Based on this information, processor 210c determines that its earliest sample in time, $C_1$, is later in time than sample $B_1$, and therefore sends sample $B_1$ index information to processor 210d. Based on this information, processor 210d determines that its earliest sample in time, $D_1$, is later in time than sample $B_1$, and therefore sends sample $B_1$ index information to processor 210a. Based on this information, processor 210a determines that sample $B_1$ is later in time than sample $A_1$, and therefore determines that sample $A_1$ is the earliest sample in time slot 1 that is below $TH_L$. However, because the index information that the processor 210a has indicates that an earlier sample below $TH_L$ was found in time slot 0, the processor 210a ignores sample $A_1$. In other words, the algorithm was already armed when it began processing time slot 1 due the latest qualified sample in time slot 0, sample D0, being below $TH_L$.

Also during the first pass in time slot 1, the processors 210a-210d locate their respective latest qualified samples in time. As indicated above, the latest qualified sample in time slot 1 is used to determine the starting state for time slot 2. In time slot 1, samples $A_4$, $B_4$, $C_4$, and $D_4$ are the latest qualified samples within their respective processors 210a-210d. However, in all of these cases, those samples are above $TH_H$. Because the final, fully processed qualified sample in time slot 1 is above $TH_H$, the first-pass processing for time slot 2 requires finding a sample below $TH_L$ before arming the algorithm to be capable of detecting a trigger.

The second pass of the algorithm for time slot 1 locates the earliest sample in time that is above $TH_H$ and after the earliest sample in time that is below $TH_L$, which is sample $D_0$. As indicated above, this earliest sample can be from a previous time slot, which in this case is time slot 0. Thus, the previous time slot index would be the reference index sent in step 279 of FIG. 5A from the master processor 210a to the first processor 210b. However, the entire reference index does not need to be sent. It is sufficient that a single bit is sent indicating that a reference index from the previous time slot is the earliest sample that is below $TH_L$. As mentioned above, with the invalid indicator, an otherwise unused index can be used to represent this state rather than a unique bit. In time slot 1, samples $A_4$, $B_4$, $C_4$, and $D_3$ qualify within their respective processors 210a-210d as the earliest samples in time that are above $TH_H$ and after $D_0$ in time. Processor 210b sends sample $B_4$ index information to processor 210c. Based on this information, processor 210c determines that its earliest sample in time, $C_4$, is not earlier in time than sample $B_4$, and therefore sends sample $B_4$ index information to processor 210d. Based on this information, processor 210d determines that its earliest sample in time, $D_3$, is earlier in time than sample $B_4$, and therefore sends sample $D_3$ index information to processor 210a.

At this point, processor 210a knows that a trigger occurred between sample $D_3$ and its immediate predecessor sample, which is sample $C_3$. The algorithm could be adapted to perform an additional pass to obtain the actual sample values of at least samples $C_3$ and $D_3$. As indicated above, interpolation may be used to determine when in time the trigger threshold level crossing occurred between samples $C_3$ and $D_3$ or it can be assumed that the trigger occurred at an instant in time one-half way in between the instants in time when samples $C_3$ and $D_3$ occurred. The algorithm can be modified in many ways to locate the trigger threshold level crossing within a desired degree of precision, as will be understood by those of skill in the art in view of the discussion provided herein.

More of the surrounding samples could be shared to allow higher order interpolation techniques to be used. There may be tradeoffs between latency and trigger locating precision, e.g., a trade-off between the number and data rates of SERDES that are used and the amount of latency encountered in determining that the precise trigger threshold level crossing location.

A technology known as "Jitter Free" technology has been patented by the assignee of the present application in U.S. Pat. No. 6,753,677, which is incorporated by reference herein in its entirety. Jitter Free technology may be used to correct for trigger jitter in an oscilloscope or other data acquisition system caused by horizontal noise and the imperfect response of the trigger event's analog signal paths. The Jitter Free method relies on standard triggering hardware to locate a trigger event in a waveform to within some small error, e.g., one nanosecond (ns) or less. Once the trigger event has been located, the Jitter Free method then processes the data acquired around the trigger event, optionally correcting the signal for various impairments in the signal path of the channel, and then locates the time of the trigger threshold crossing in the data. The time of the trigger threshold crossing may then be used for other purposes, such as, for example, plotting, making measurements and further signal processing. In the case above where the trigger threshold level crossing is assumed to have occurred at an instant in time one-half way in between the instants in time when samples $C_3$ and $D_3$ occurred, use of the Jitter Free technology in conjunction with the system and method disclosed herein makes this assumption even more acceptable.

Only a portion of time slots 0 and 2 are shown for ease of illustration. In time slot 2, the previous time slot ended with a qualified sample above the $TH_H$ and there are no samples in time slot 2 that are below $TH_L$. Therefore, there cannot be a trigger in the portion of time slot 2 shown in FIG. 6. This is quickly determined on the first pass of the algorithm. If sample $A_6$ had been below $TH_L$, then the algorithm would find a trigger between samples $A_6$ and $B_6$. In that case, sample $A_6$ would be the first sample below the $TH_L$ and sample $B_6$ would be the earliest sample after sample $A_6$ that is above $TH_H$.

In accordance with illustrative embodiments described herein, the algorithm only finds one trigger per time slot, and in accordance with this embodiment, the algorithm finds the first trigger per time slot. This is sufficient because a measurement system such as an oscilloscope, for example, is only capable of processing a limited number of triggers per second and there are no existing solutions available today that are capable of triggering at the full signal bandwidth of a high bandwidth oscilloscope. The algorithm could easily be adapted to locate the last trigger in each time slot.

Figure 7:
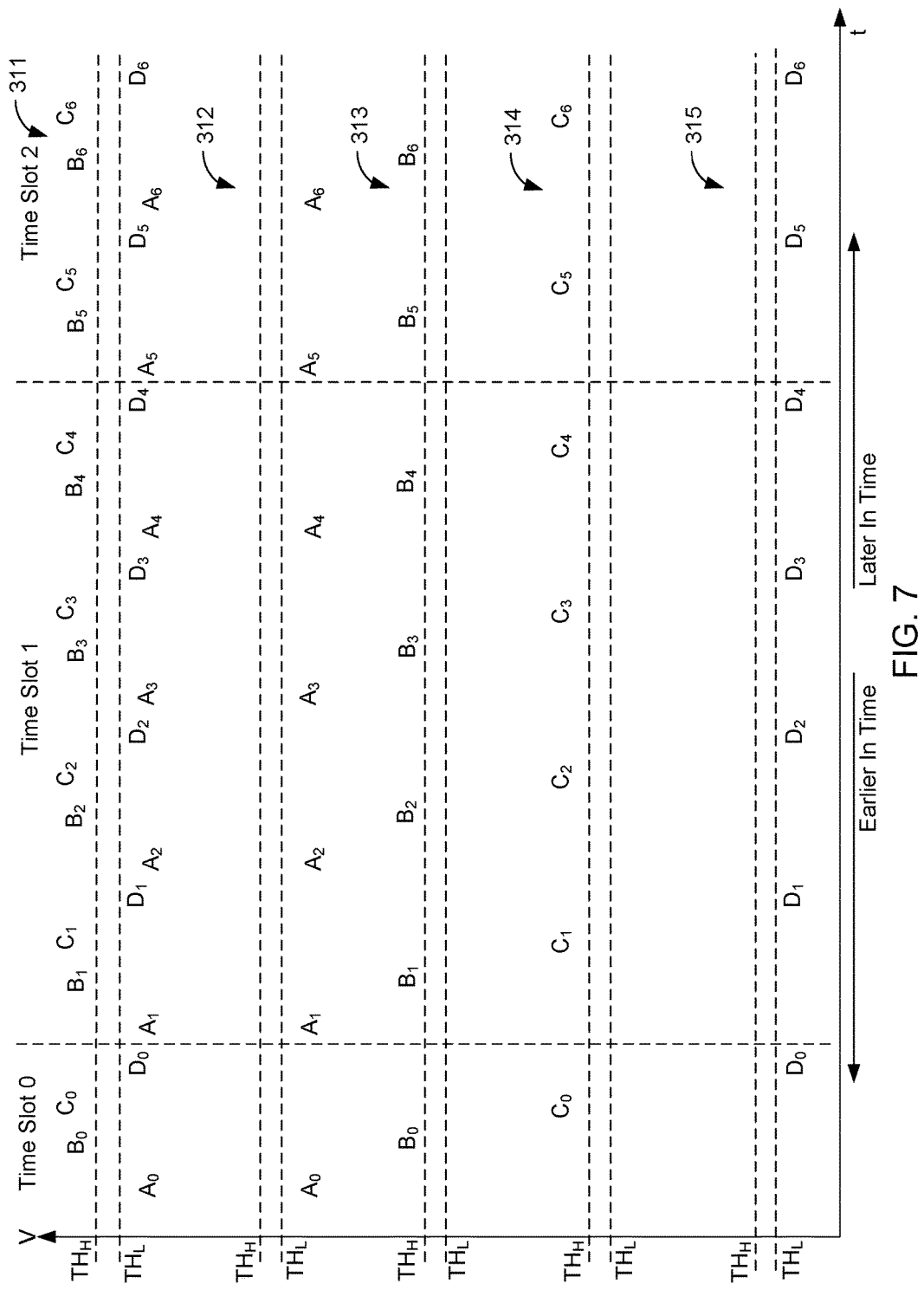
FIG. 7 illustrates plots of digital data samples output from the ADCs shown in FIG. 3 over a time period that will be used to provide another example of the manner in which the processors shown in FIG. 3 process samples output from the respective ADCs and share information to detect a rising edge trigger.

FIG. 7 illustrates a plot of digital data samples output from the ADCs 111a-111d over a period of time and will be used to provide another example of the manner in which the processors 210a-210d process samples and share information to detect a rising edge trigger. The sampled waveform 311 in this example is a high frequency sine wave. The waveforms 312-315 are made up of digital data samples A-D, respectively, output from ADCs 111a-111d, respectively, and input to processors 210a-210d, respectively. The sine waveform 311 has a period of four samples, and therefore has a frequency that is one-fourth of the interleaved sample rate. To each of the processors 210a-210d, the signal looks like a direct current (DC) signal, with the A and D samples below $TH_L$ and the B and C samples above $TH_H$.

On the first passes of the algorithm for time slots 0-2, processor 210a determines, based on the index information shared with it via the daisy chain configuration of the processors 210a-210d, that the earliest sample below $TH_L$ is from processor 210a and that the latest qualified sample is from processor 210d. In the first passes of the algorithm, processor 210b informs processor 210c that it has no samples below $TH_L$. As indicated above, an invalid indication is sent for this purpose. Processor 210c sends the same information to processor 210d. Processor 210d sends its early and late sample indices to processor 210a. Processor 210a determines that the reference index to use for time slot 1 as its earliest sample below $TH_L$ is the index for sample $D_0$ from the previous time slot, that the latest qualified sample is sample $D_4$ and that sample $D_4$ is below $TH_L$. The reference index to use for time slot 2 as its earliest sample below $TH_L$ is the index for sample $D_4$ from the previous time slot.

On the second pass of the algorithm, processor 210c determines, through the index information shared with it via the daisy chain configuration of the processors 210a-210d, that the earliest sample in time slot 1 that is above $TH_H$ and after sample $D_0$ is sample $B_1$ and that its earliest sample in time slot 2 above $TH_H$ and after sample $D_4$ is sample $B_5$. Based on all of this information obtained by processor 210a during the first and second passes of the algorithm, processor 210a determines that samples $B_1$ and $B_5$ from processor 210b indicate that trigger threshold level crossings occurred between samples $A_1$ and $B_1$ in time slot 1 and between samples $A_5$ and $B_5$ in time slot 2.

Although the illustrative embodiments have been described with reference to detecting rising edge triggers, persons of skill in the art will understand, in view of the description provided herein, the manner in which the processors 210a-210d could similarly share information to detect other types of edge triggers at the full rate of the measurement system 100, including, falling edge triggers and more complex edge triggers. For example, to detect a falling edge trigger, the processors 210a-210d would share information via the daisy chain configuration shown in FIG. 3 through which the master processor, e.g., processor 210a, could determine the qualified digital data sample that is latest in time, and the digital data sample that is earliest in time and that is above $TH_H$. An "either edge" trigger can be similarly detected.

It should also be noted that the daisy chain configuration shown in FIG. 3 is one of multiple configurations that may be used to pass information among the processors 210a-210d. Another example of a configuration that could be used would be to use additional SERDES interfaces on the master processor to connect each of the processors directly to the master processor. Each processor would then pass its index information directly to the master processor and the master processor would pass index information for the next pass directly to each of the other processors.

The algorithms described above with reference to FIGS. 2-7 are performed or caused to be performed by the processors 210a-210d. In order to carry out the tasks associated with performing these algorithms, the processors 210a-210d are configured to execute computer instructions, or code, in the form of software and/or firmware or to perform some or all of the tasks solely in hardware. For tasks that are performed in software and/or firmware, the instructions are stored in one or more memory devices that are internal to or external to the measurement system 100. Such memory devices constitute non-transient computer-readable mediums. A variety of non-transient computer-readable mediums are suitable for use with the invention, including, for example, solid state storage devices, magnetic storage devices and optical storage devices.

It should be noted that the invention has been described with reference to illustrative, or representative, embodiments and that the invention is not limited to the disclosed embodiments. Many variations may be made to the disclosed embodiments without deviating from the scope of the invention, as will be understood by those of skill in the art in view of the description provided herein, the drawings, and the appended claims.

What is claimed is:

1. A measurement system comprising:
   N time-interleaved analog-to-digital converters (ADCs) that receive and sample a time-varying waveform to produce N digital data sets, respectively, where N is a positive integer that is equal to or greater than 2, each digital data set comprising digital data samples that are time-interleaved with the digital data samples of the other digital data sets; and
   a digital edge trigger system comprising N processor circuits, each of the N processor circuits receiving a respective digital data set and performing an edge trigger detection algorithm that processes the respective digital data set to determine whether a respective early sample in time that is below a lower threshold value, $TH_L$, exists, to determine whether a respective late sample in time that is below $TH_L$ or above a higher threshold value, $TH_H$, exists, and to determine whether a respective early sample in time that is above $TH_H$ exists, the N processor circuits sharing information regarding any early samples in time below $TH_L$, any late samples in time below $TH_L$ or above $TH_H$, and any early samples in time above $TH_H$ to determine whether a trigger threshold level crossing has been detected.

2. The measurement system of claim 1, wherein at least one of the N processor circuits determines, based on the shared information, which early sample in time below $TH_L$, when any exists, is the earliest sample in time below $TH_L$, which late sample in time below $TH_L$ or above $TH_H$, when any exists, is the latest sample in time below $TH_L$ or above $TH_H$, and which early sample in time above $TH_H$, when any exists, is the earliest sample in time above $TH_H$, and wherein said at least one of the N processor circuits processor uses the earliest sample in time below $TH_L$, the latest sample in time below $TH_L$ or above $TH_H$, and the earliest sample in time above $TH_H$ and after the earliest sample in time below $TH_L$ to determine whether a trigger threshold level crossing has been detected.

3. The measurement system of claim 2, wherein the N processor circuits are connected in a daisy chain configuration such that each of the N processor circuits is connected to two adjacent processor circuits, and wherein said at least one of the processors functions as a master processor of the daisy chain configuration.

4. The measurement system of claim 3, wherein each one of the N processor circuits includes first and second serializer/deserializer (SERDES) interfaces that are connected to the first and second SERDES interfaces, respectively, of at least one of the other one of the N processor circuits to form the daisy chain interconnection among the one of the N processor circuits.

5. The measurement system of claim 2, wherein said at least one of the N processor circuits is a master processor and is connected directly to all of the other processors.

6. The measurement system of claim 5, wherein each of the N processor circuits includes at least one serializer/deserializer (SERDES) interface that is connected to a respective SERDES interface of the master processor.

7. The measurement system of claim 2, wherein the information that is shared among the the N processor circuits includes an index identifying when a sample occurred in time.

8. The measurement system of claim 7, wherein the information that is shared among the N processor circuits includes at least one bit indicating whether or not an early sample in time below $TH_L$ exists.

9. The measurement system of claim 8, wherein the information that is shared among the N processor circuits includes at least one bit indicating whether or not an early sample in time above $TH_H$ exists.

10. The measurement system of claim 9, wherein the information that is shared among the N processor circuits includes at least one bit indicating whether or not a late sample in time below $TH_L$ or above $TH_H$ exists.

11. The measurement system of claim 2, wherein at least one of the N processor circuits acts as a master processor circuit, and wherein the master processor circuit determines whether the latest sample in time below $TH_L$ or above $TH_H$ in a previous time slot is below $TH_L$, and when so, determines that a trigger threshold level crossing has been detected in a current time slot when an earliest sample in time in the current time slot above $TH_H$ exists, and wherein when the master processor circuit determines that the latest sample in time below $TH_L$ or above $TH_H$ in the previous time slot is above $TH_H$, the master processor circuit determines that a trigger threshold level crossing has been detected in the current time slot when an earliest sample in time in the current time slot above $TH_H$ and later in time than the earliest sample below $TH_L$ in the current time slot exists, and wherein when the master processor circuit determines that a trigger threshold crossing has been detected, the master processor circuit decides that the trigger threshold level crossing occurred at some instant in time in between the earliest sample above $TH_H$ and a sample that immediately preceded the earliest sample above $TH_H$ in time.

12. The measurement system of claim 11, wherein when the master processor circuit determines that a trigger threshold level crossing occurred, the master processor circuit performs an estimation algorithm that estimates that the trigger threshold level crossing occurred at an instant in time one-half way in between an instant in time when the earliest sample above $TH_H$ occurred and an instant in time when the sample occurred that immediately preceded the earliest sample above $TH_H$.

13. The measurement system of claim 11, wherein when the master processor circuit determines that a trigger threshold level crossing occurred, the master processor circuit performs an interpolation algorithm that interpolates an instant in time in between an instant in time when the earliest sample above $TH_H$ occurred and an instant in time when the sample occurred that immediately preceded the earliest sample above $TH_H$ as being the instant in time when the trigger threshold level crossing occurred.

14. The measurement system of claim 1, wherein the digital trigger system operates at a full signal bandwidth of the measurement system.

15. A measurement system comprising:
N time-interleaved analog-to-digital converters (ADCs), the ADCs sampling a time-varying waveform at instants in time that are offset from one another in time to produce N respective digital data sets that are time-interleaved, each digital data set comprising digital data samples, and wherein N is a positive integer that is equal to or greater than 2; and
N processor, each processor being interconnected with a respective ADC to receive a respective digital data set from the respective ADC, the processors being connected in a daisy chain configuration such that each processor communicates with at least one adjacent processor in the daisy chain configuration, and wherein each processor performs an edge trigger detection algorithm that processes the respective digital data set to determine whether a respective early sample in time that is below a lower threshold value, $TH_L$, exists, to determine whether a respective late sample in time that is below $TH_L$ or above a higher threshold value, $TH_H$, exists, and to determine whether a respective early sample in time that is above $TH_H$ exists, the processors sharing information, via the daisy chain configuration, regarding any early samples in time below $TH_L$, any late samples in time below $TH_L$ or above $TH_H$, and any early samples in time above $TH_H$ to determine which early sample in time below $TH_L$, when any exists, is the earliest sample in time below $TH_L$, which late sample in time below $TH_L$ or above $TH_H$, when any exists, is the latest sample in time below $TH_L$ or above $TH_H$, and which early sample in time above $TH_H$, when any exists, is the earliest sample in time above $TH_H$, and wherein at least one of the processors acts as a master processor that uses the earliest sample in time below $TH_L$, the latest sample in time below $TH_L$ or above $TH_H$, and the earliest sample in time above $TH_H$ that was later than the earliest sample in time below $TH_L$ to determine whether a trigger threshold level crossing has been detected.

16. The measurement system of claim 15, wherein each processors includes first and second serializer/deserializer (SERDES) interfaces that are connected to the first and second SERDES interfaces, respectively, of at least one of the other processors to form the daisy chain configuration.

17. The measurement system of claim 15, wherein the master processor determines whether the latest sample in time below $TH_L$ or above $TH_H$ in a previous time slot is below $TH_L$, and when so, determines that a trigger threshold level crossing has been detected in a current time slot when an earliest sample in time in the current time slot above $TH_H$ and later in time than the latest sample below $TH_L$ from the previous time slot exists, and wherein when the master processor determines that the latest sample in time below $TH_L$ or above $TH_H$ in the previous time slot is above $TH_H$, the master processor determines that a trigger threshold level crossing has been detected in the current time slot when an earliest sample in time in the current time slot above $TH_H$ and later in time than the earliest sample below $TH_L$ in the current time slot exists, and wherein when the master processor determines that a trigger threshold crossing has been detected, the master processor decides that the trigger threshold level crossing occurred at some instant in time in between the earliest sample above $TH_H$ in the current time slot and a sample that immediately preceded the earliest sample above $TH_H$ in time.

18. The measurement system of claim 17, wherein when the master processor determines that a trigger threshold level crossing occurred, the master processor performs an estimation algorithm that estimates that the trigger threshold level crossing occurred at an instant in time one-half way in between an instant in time when the earliest sample above $TH_H$ occurred and an instant in time when the sample occurred that immediately preceded the earliest sample above $TH_H$ in time.

19. The measurement system of claim 17, wherein when the master processor determines that a trigger threshold level crossing occurred, the master processor performs an interpolation algorithm that interpolates an instant in time in between an instant in time when the earliest sample above $TH_H$ occurred and an instant in time when the sample occurred that immediately preceded the earliest sample above $TH_H$ as being the instant in time when the trigger threshold level crossing occurred.

20. A method for detecting edge triggers in a measurement system, the method comprising:
  in a plurality of processors that receive time-interleaved samples output from respective time-interleaved analog-to-digital converters (ADCs), cooperating with one another to perform a first-pass process of an edge trigger detection algorithm, wherein the first-pass process comprises:
    determining whether an earliest sample in time exists in each of a plurality of time slots that is below a lower threshold level, $TH_L$, and when so, identifying the earliest samples,
    determining whether a latest sample in time exists in each of the time slots that is below $TH_L$ or above a higher threshold level, $TH_H$, and when so, identifying the latest samples, and
    generating an indication that indicates whether the latest sample in time is below $TH_L$ or is above $TH_H$; and
  in the plurality of processors, cooperating with one another to perform a second-pass process of the edge detection algorithm, wherein the second-pass process comprises:
    for each time slot, when said indication indicates that the latest sample in time from the previous time slot is below $TH_L$, detecting a trigger threshold level crossing by determining whether an earliest sample in time exists in the current time slot that is above $TH_H$, and
    for each time slot, when said indication indicates that the latest sample in time from the previous time slot is above $TH_H$, detecting a trigger threshold level crossing by determining whether an earliest sample in time exists in the current time slot that is above $TH_H$ and is later in time than the earliest sample in time in the current time slot that is below $TH_L$.

* * * * *